(12) United States Patent
Ishizuka et al.

(10) Patent No.: US 6,259,325 B1
(45) Date of Patent: Jul. 10, 2001

(54) SINGLE-ENDED SIGNALS TO DIFFERENTIAL SIGNALS CONVERTER

(75) Inventors: Shin'ichiro Ishizuka, Yokohama; Yasunori Miyahara, Ayase, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/448,442

(22) Filed: Nov. 24, 1999

(30) Foreign Application Priority Data

Nov. 25, 1998 (JP) ................................ 10-334753

(51) Int. Cl.[7] .................................................. H03F 3/04
(52) U.S. Cl. ............................................ 330/301; 330/307
(58) Field of Search .................................. 330/165, 171, 330/301, 307; 327/359

(56) References Cited

U.S. PATENT DOCUMENTS

| | | | | |
|---|---|---|---|---|
| 2,192,684 | * | 3/1940 | Crosby | 250/20 |
| 3,078,420 | * | 2/1963 | Bussard | 330/29 |
| 3,154,750 | * | 10/1964 | David et al. | 330/14 |
| 3,302,125 | * | 1/1967 | Ulug | 330/46 |
| 5,793,262 | * | 8/1998 | Kuwana | 333/25 |

FOREIGN PATENT DOCUMENTS 8-222439   8/1996   (JP).

OTHER PUBLICATIONS

John R. Long, et al. "A 1.9 Ghz Low–Voltage Silicon Bipolar Receiver Front–End for Wireless Personal Communications Systems," IEEE Journal of Solid–State Circuits, vol. 30, No. 12, Dec. 1995, pp. 1438–1448.

* cited by examiner

Primary Examiner—Robert Pascal
Assistant Examiner—Henry Choe
(74) Attorney, Agent, or Firm—Oblon, Spivak, McClelland, Maier & Neustadt, P.C.

(57) ABSTRACT

The present invention discloses a single-ended signals to differential signals converter. In this invention, a first circuit comprising a transistor outputting single-ended signals and a first spiral inductor connected as an inductor for load use that contributes in determining frequency characteristics of a first circuit to either one of output terminals of higher voltage side and lower voltage side of the transistor, and a second circuit comprising a pair of differential input terminals for inputting differential signals and a second spiral inductor that is magnetically coupled with the first spiral inductor, and both ends thereof are connected to the differential input terminals, respectively, are formed within a monolithic integrated circuit.

38 Claims, 11 Drawing Sheets

SINGLE-ENDED SIGNALS TO DIFFERENTIAL SIGNALS CONVERTER

BACKGROUND OF THE INVENTION

1. Field of the Invention

The present invention relates to a converter for converting single-ended signals to differential signals, which is necessary for receiving an output of a single-ended signal circuit by use of a differential-end signal circuit, in particular relates to a converter of converting single-ended signals to differential signals within a monolithic integrated circuit (IC).

2. Description of the Related Art

Figure 12:
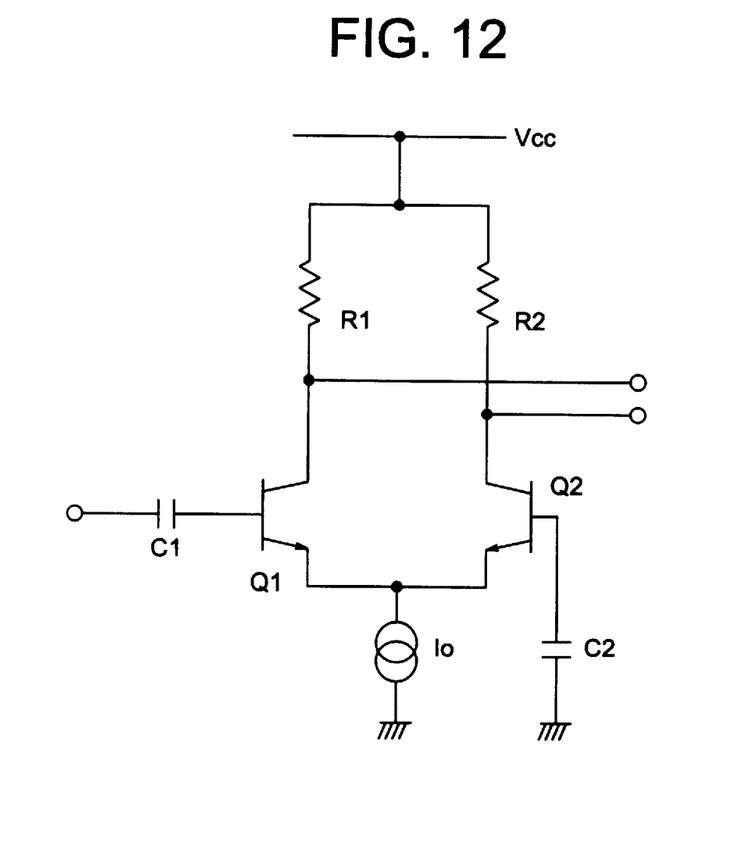
FIG. 12 is a diagram showing an existing converter for single-ended signals to differential signals conversion.

In an analogue circuit, a single-ended signals to differential signals converter for converting single-ended signals to differential signals is a very important basic circuit. FIG. 12 shows an existing single-ended signals to differential signals converter employing a differential amplifier.

This circuit operates as follows. That is, a single-ended input signal inputted from an input terminal is inputted to a base of a transistor Q1 through a coupling capacitor C1. On the other hand, a base of a transistor Q2 is grounded through a capacitor C2 of identical capacitance with that of the capacitor C1. The transistors Q1 and Q2 form a transistor pair coupled to each other through an emitter and from collectors of the transistors Q1 and Q2, a pair of differential signals converted from the input signal are outputted.

If this circuit operates ideally, the differential output does not contain common mode components. Accordingly, outputs of the differential signals are summed up to be a definite potential. In an actual circuit, however, there is a problem that common mode components remain between the outputs of differential signals, as a result of this, the summation of outputs of differential signals is not a definite potential. This is caused by a fact that the impedance of a bias current supply $I_0$ of the emitter-coupled transistor pair is not infinite in an actual circuit.

Figure 13:
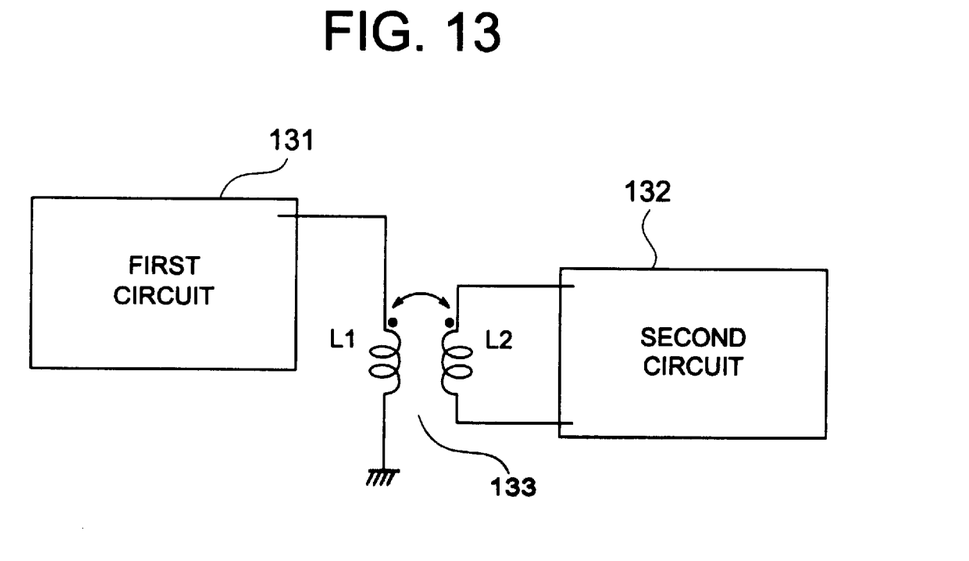
FIG. 13 is a diagram showing another existing converter for single-ended signals to differential signals conversion.

FIG. 13 is an existing single-ended signals to differential signals converter employing a transformer. In this method, a separate transformer 133 other than the first circuit 131 and the second circuit 132 is employed to implement single-ended signals to differential signals conversion. Here, to a primary coil L1 of the transformer 133 a single-ended output terminal of the first circuit 131 is connected, and to a secondary coil L2 of the transformer 133 a differential input terminal of the second circuit 132.

However, in general a transformer has an area far bigger than that of a transistor or a resistor incorporated in an integrated circuit (IC). Accordingly, there is a problem that an area of circuits as a whole becomes large.

SUMMARY OF THE INVENTION

In the aforementioned existing single-ended signals to differential signals converter, there are problems that common mode components are large after conversion and a circuit itself that carries out single-ended signals to differential signals conversion is large.

An object of the present invention is to provide, without inducing an increase of a chip area of an integrated circuit, a single-ended signals to differential signals converter incorporated in an integrated circuit.

Another object of the present invention is to provide a converter for single-ended signals to differential signals conversion small in common mode components contained in the differential signals.

To these ends, a converter for single-ended signals to differential signals conversion formed within an integrated circuit involving the present invention comprises a first circuit formed within the integrated circuit, and a second circuit formed within the integrated circuit. Here, the first circuit comprises a transistor outputting single-ended signals and a first spiral inductor that is connected to an output terminal of either one of output terminals of higher voltage side and lower voltage side of the transistor as a an inductor for load use contributing to frequency performance of the first circuit. And the second circuit comprises a pair of differential input terminals inputting differential signals and a second spiral inductor that is magnetically coupled with the first spiral inductor and both ends thereof are connected to the respective differential input terminals.

According to the aforementioned means, an inductor itself that is used as a load contributing to frequency performance of the first circuit can be used as a part of the single-ended signals to differential signals converter. Accordingly, without increasing the chip area and current consumption, single-ended signals to differential signals conversion can be implemented.

A converter for single-ended signals to differential signals conversion formed within an integrated circuit of the present invention comprises a first circuit formed within the integrated circuit and a second circuit formed within the integrated circuit. Here, the first circuit is a resonant circuit in which a first spiral inductor is used as a resonator and outputs a single-ended signal. The second circuit comprises a pair of differential input terminals inputting differential signals and a second spiral inductor coupled magnetically to the first spiral inductor and both ends thereof are connected to the respective differential input terminals.

According to the aforementioned means, an inductor that is a resonator can be used as a part of a converter for single-ended signals to differential signals conversion. As a result of this, without increasing the chip area and current consumption, single-ended signals to differential signals conversion can be implemented.

Further, a converter for single-ended signals to differential signals conversion formed within an integrated circuit involving the present invention comprises a first circuit formed within the integrated circuit, and a second circuit formed within the integrated circuit. Here, the first circuit comprises a transistor outputting single-ended signals and a first and second spiral inductors that are connected to respective output terminals of a higher voltage side and a lower voltage side of the transistor as inductors for load use contributing frequency performance of the first circuit and are disposed so as to strengthen generated magnetic fluxes to each other. The second circuit comprises a pair of differential input terminals inputting differential signals and a third spiral inductor coupled magnetically to the first and second spiral inductors and both ends thereof are connected to the respective differential input terminals.

According to the aforementioned means, due to a synergistic effect between the first and second spiral inductors, upon converting differentially, conversion gain can be increased. Further, the first and second spiral inductors perform functions of impedance matching with a preceding circuit and of contribution to frequency performance of the first circuit. Accordingly, only a little bit of increase of the area of an IC chip is caused.

DESCRIPTION OF THE PREFERRED EMBODIMENTS

In the following, embodiments involving the present invention will be explained in detail with reference to drawings.

(Embodiment 1)

Figure 1:
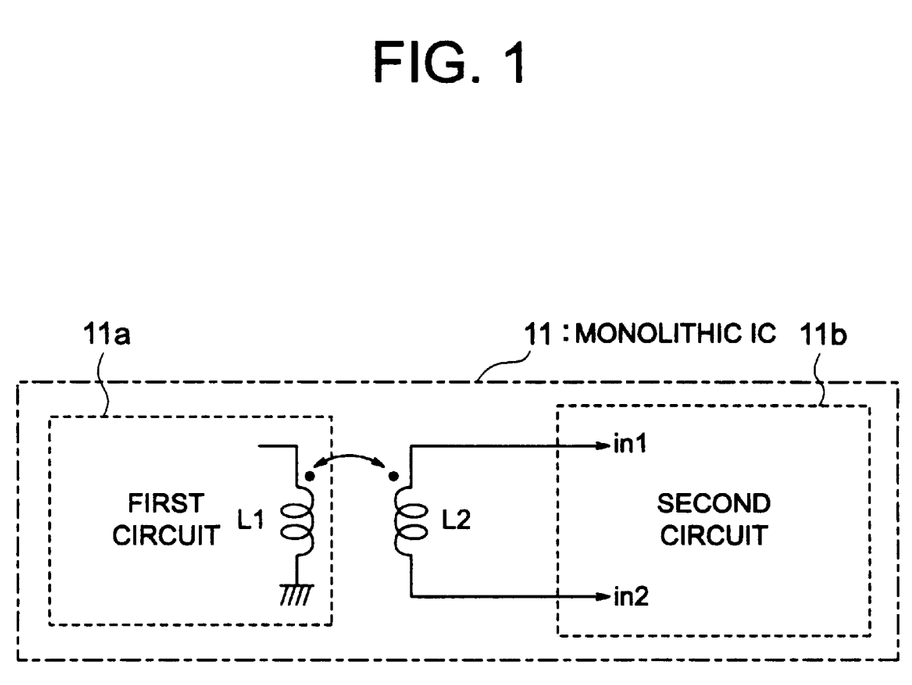
FIG. 1 is a diagram showing an embodiment of a converter for single-ended signals to differential signals conversion involving the present invention.

FIG. 1 is a diagram showing a first embodiment of a converter for single-ended signals to differential signals conversion involving the present invention. In FIG. 1, an IC 11 is a so-called monolithic IC in which circuit elements are formed as circuits on a silicon substrate. Within this IC 11, a first circuit 11a and a second circuit 11b are formed. A spiral inductor L1 constitutes one component of the first circuit 11a and is used as an output load of the first circuit 11a. One end of the spiral inductor L1 is connected to an output terminal for outputting a single-ended signal of the first circuit 11a and the other end is grounded. Here, the ground level needs only to be a definite potential and is not necessarily required to be zero potential. This is same for all embodiments illustrated in FIGS. 2 to 11. The spiral inductor L2 is disposed to couple magnetically with the spiral inductor L1 and both ends thereof are connected to differential signal input terminals in1 and in2 of the second circuit 11b, respectively.

In the spiral inductor L2, a current corresponding to the variation of a current flowing in the spiral inductor L1 flows. Both ends of the spiral inductor L2 are connected to the differential input terminals in1 and in2 under an approximately identical condition. Accordingly, between the ends, differential signals are outputted. Thus, single-ended signals to differential signals conversion is carried out.

Figure 2:
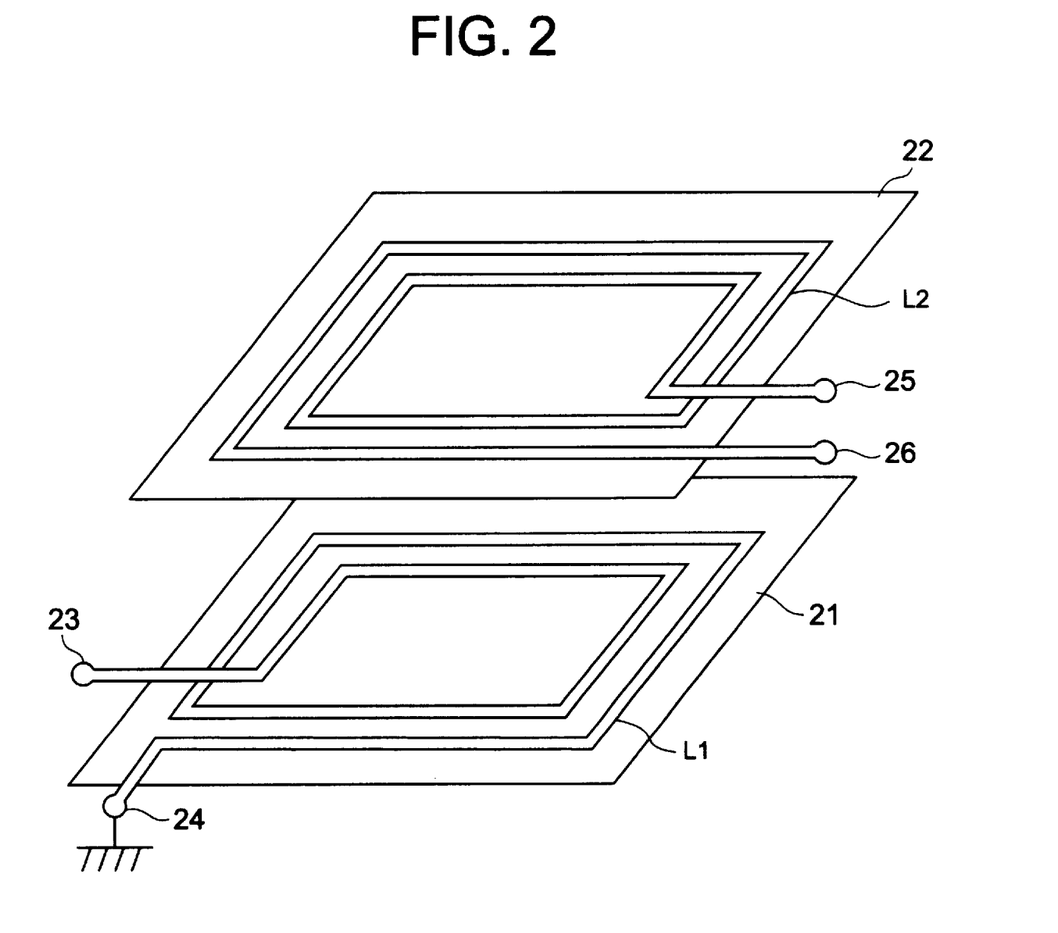
FIG. 2 is a diagram showing a constitution example of an essential portion of FIG. 1.

FIG. 2 is a diagram showing constitution examples of spiral inductors L1 and L2 being used in FIG. 1. On a semiconductor substrate, a first wiring layer 21 and a second wiring layer 22 are formed stacked. Between the first wiring layer 21 and the second wiring layer 22, there is interposed an insulating layer. The spiral inductor L1 is formed within the first wiring layer 21 of the IC 11 by winding wiring several turns. One end 23 of the spiral inductor L1 is an input terminal of single-ended signals for inputting a single-ended signal from the first circuit 11a. The other end 24 is grounded. The spiral inductor L2 is formed within the second wiring layer 22 by winding wiring several turns. Both ends 25 and 26 of the spiral inductor L2 are differential signal outputting terminals outputting differential signals to the second circuit 11b.

The spiral inductors L1 and L2 are formed by use of the process of forming the first and second wiring layers 21 and 22 of the monolithic IC 11 and disposed at positions capable of magnetically coupling to each other on the first and second wiring layers 21 and 22.

In this embodiment, the spiral inductor L1 is formed within the first wiring layer 21 to be a part of wiring constituting the first circuit 11a. The spiral inductor L2 is formed within the second wiring 22 and both ends thereof are connected to the differential input terminals in1 and in2 of the second circuit 11b. Thus, a single-ended signals to differential signals converter is formed.

The spiral inductor L1 can be as well used as a component constituting the first circuit 11a. For instance, when the first circuit 11a is an amplifier, the inductor for load use can be used as an inductance for load use that contributes in determination of the frequency performance such as a gain in high frequency. When the spiral inductor L1 is concurrently used like this, with only a small increase of the chip area of the IC 11, single-ended signals to differential signals conversion is realized.

When the inductance for load use is employed, compared with the case of using a resistor for load use, high-frequency performance of such as the gain can be improved. In addition, the inductor for load use is less generative of noise compared with a resistor for load use. Accordingly, the inductor for load use is more appropriate than the resistor in processing feeble signals in the first circuit.

(Embodiment 2)

Figure 3:
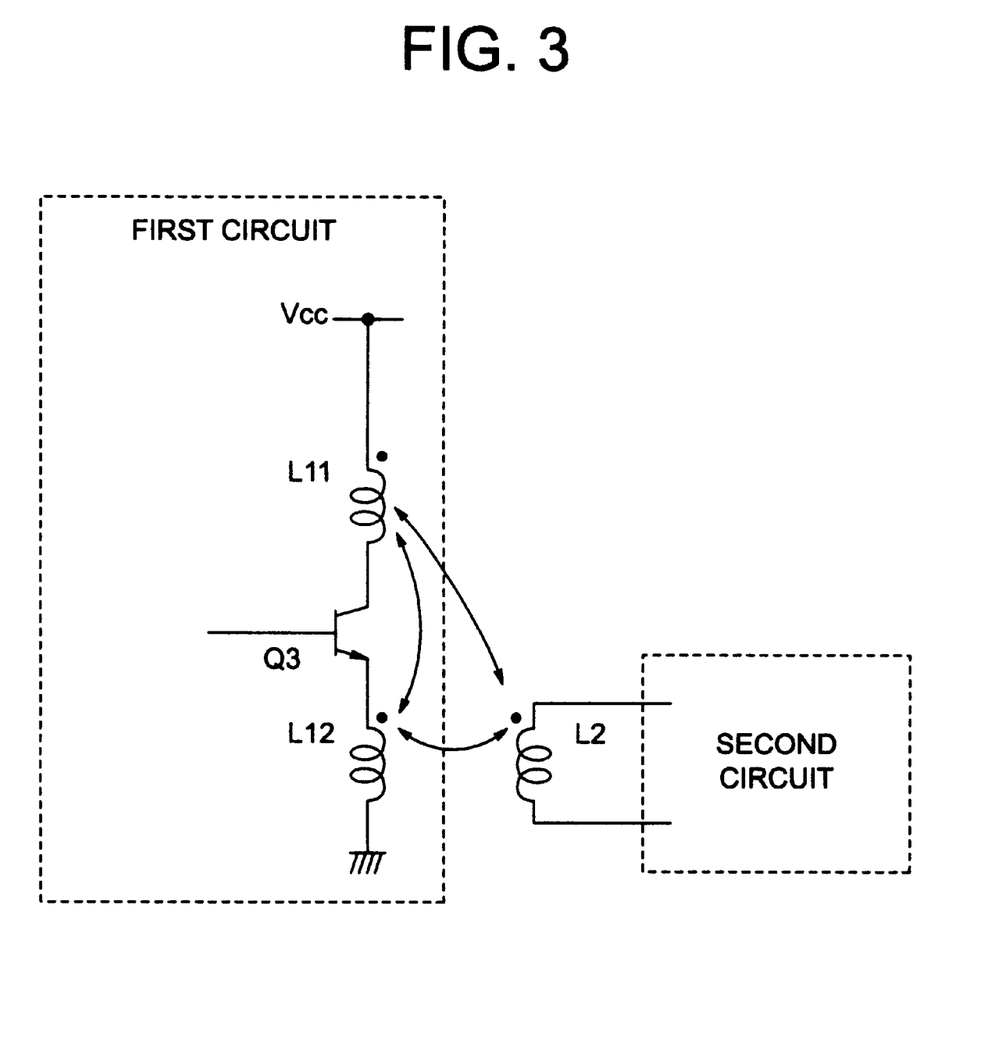
FIG. 3 is a diagram showing an embodiment of a converter for single-ended signals to differential signals conversion involving the present invention.

FIG. 3 is a diagram showing a second embodiment of a converter for single-ended signals to differential signals conversion involving the present invention. In this embodiment, instead of the spiral inductor L1 of FIG. 1, two magnetically coupled spiral inductors L11 and L12 formed in the first circuit are used and therewith a separate spiral inductor L2 is magnetically coupled.

The spiral inductors L11 and L12 are connected to between a collector and power source Vcc of a transistor Q3 of an output stage and between an emitter and a ground of the transistor Q3, respectively. The spiral inductors L11 and L12 are disposed so as to strengthen magnetic fluxes each generated. The spiral inductor L2 is disposed so as to couple magnetically with both of the spiral inductors L11 and L12. Both ends of the spiral inductor L2 are connected to a pair of input of the second circuit. As a result of this, a single-ended signal outputted from the transistor Q3 is converted to a differential signal to input in the second circuit.

In this constitution, both of the spiral inductors L11 and L12 are magnetically coupled with the spiral inductor L2. That is, both magnetic fluxes of the spiral inductors L11 and L12 are linked with the spiral inductor L2. As a result of this, the intensity of the signal outputted at the both ends of the spiral inductor L2 can be strengthened, and the gain of single-ended signals to differential signals conversion can be made larger with ease.

The spiral inductor L12 is an inductor for impedance matching with a circuit that positions at the preceding stage of the transistor Q3. The spiral inductors L11 and L12 perform a function as inductors for load use that contributes in determining the frequency performance such as the gain in high frequency of the first circuit employing the transistor Q3. By using the spiral inductors L11 and L12 concurrently like this, without increasing so much the chip area of the IC, single-ended signals to differential signals conversion is realized. When only one of the spiral inductors L11 and L12 is used, this constitutes a specific example of the first embodiment.

In this embodiment, due to a synergetic effect of the spiral inductors L11 and L12, upon converting differentially, the conversion gain can be increased. In addition, the spiral inductors L11 and L12 perform functions of impedance matching with a preceding stage of circuit and of contributing in determining the frequency performance such as the gain in high frequency of the first circuit employing the transistor Q3. Accordingly, an increase of the chip area of the IC is hardly caused.

(Embodiment 3)

Figure 4:
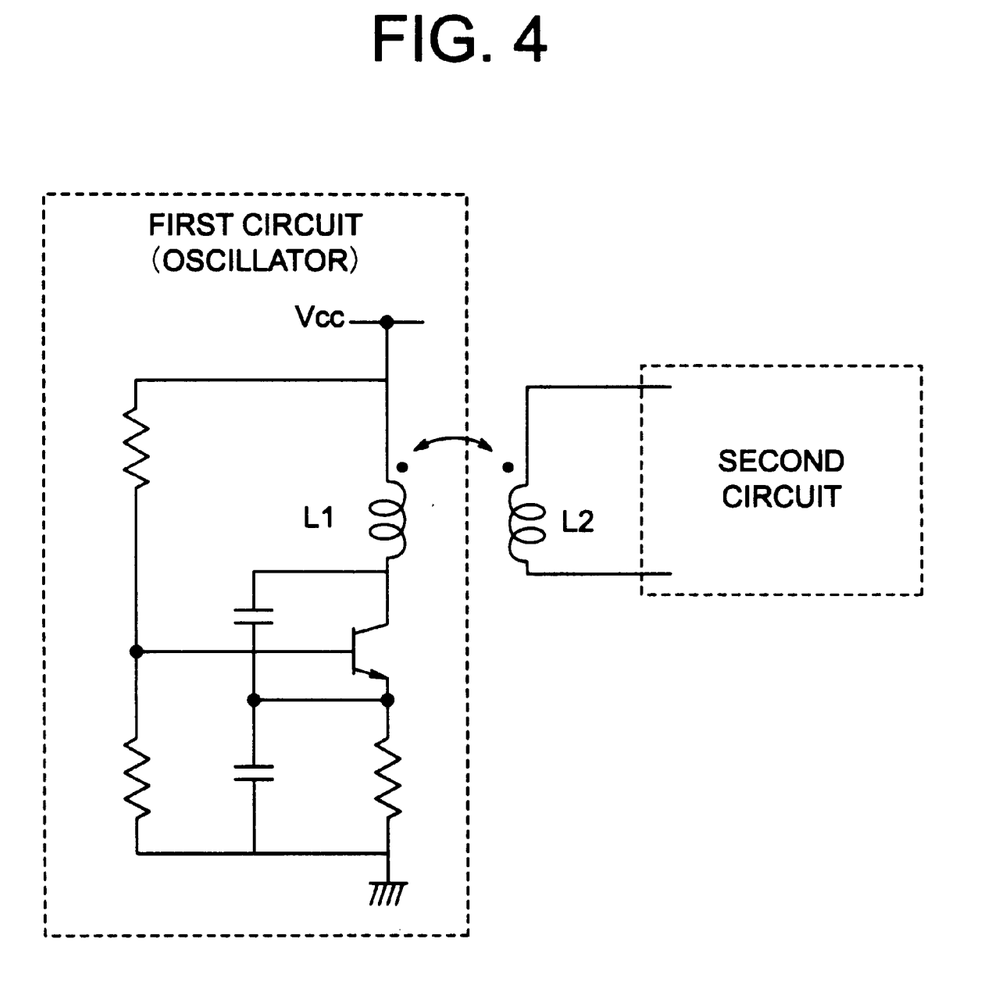
FIG. 4 is a diagram showing an embodiment of a converter for single-ended signals to differential signals conversion involving the present invention.

FIG. 4 is a diagram showing a third embodiment of a converter for single-ended signals to differential signals conversion involving the present invention. In this embodiment, a first circuit is a Colpitts oscillator and a spiral inductor L1 thereof is a resonator (tank) of the oscillator. In this embodiment also, the spiral inductor L2 is magnetically coupled with a spiral inductor L1 to output differential signals.

In this embodiment, a spiral inductor L1 performs both functions of a resonant element of the oscillator and magnetic coupling with a spiral inductor L2. As a result of this, with only a little increase of the chip area of an IC, conversion from single-ended signals to differential signals is realized.

(Embodiment 4)

Figure 5:
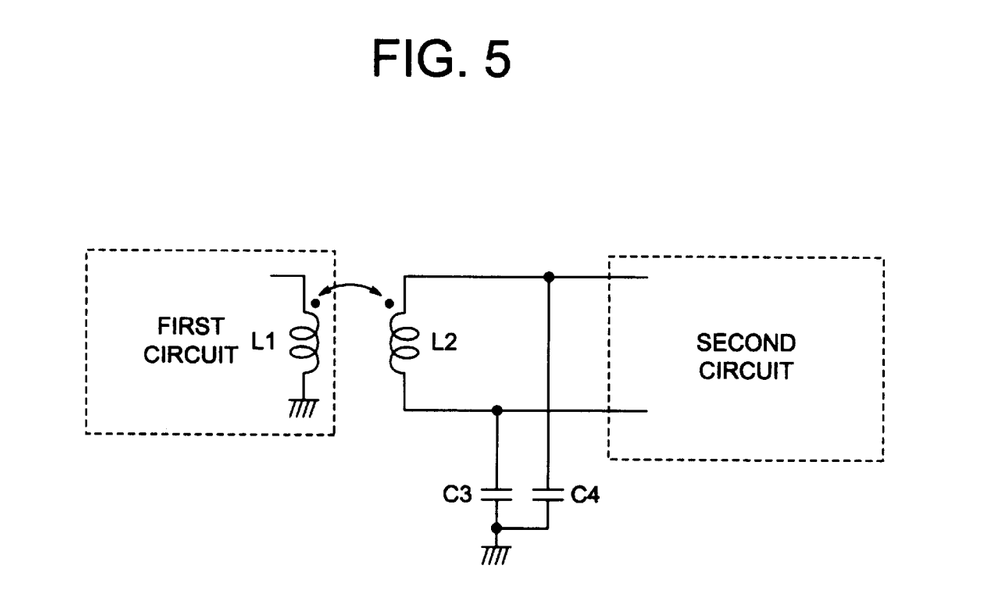
FIG. 5 is a diagram showing an embodiment of a converter for single-ended signals to differential signals conversion involving the present invention.

FIG. 5 is a diagram showing a fourth embodiment of a converter for single-ended signals to differential signals conversion of the present invention. In this embodiment, to both ends of a spiral inductor L2, one ends of condensers C3 and C4 both of the respective other ends of which are grounded are connected. This is the different point from the constitution of FIG. 1.

In this embodiment, a LC filter can be constituted of the spiral inductor L2 and condensers C3 and C4. Accordingly, a converter for single-ended signals to differential signals conversion having a function of frequency selection as well can be obtained. That is, this LC filter performs a function as a band-pass filter to reject signals of frequency components out of a desired frequency band.

Further, by equalizing capacities of the condensers C3 and C4, common mode components in the differential signals can be reduced. This will be explained in detail in the following.

In the constitution shown in FIG. 1, the spiral inductor L2 outputs the differential signals that do not ideally contain the common mode components. However, in an actual circuit, the output of the spiral inductor L2 tends to contain the common mode components. The common mode signal components in the differential signals can be quantitatively evaluated with an intensity ratio R of a differential component to a common mode component. Here, the intensity ratio R of the differential component to the common mode component is defined as follows.

$$R=(V21-V22)/(V21+V22)$$

Here, V21 and V22 are alternating voltage components outputted at the both ends of the spiral inductor L2.

In the absence of the common mode component in the differential signals, the summation of the voltages of a pair of differential signals becomes a constant value. At this time, a summation of the alternating components, that is, the value of V21+V22 becomes zero and the intensity ratio R of the differential component to the common mode component is infinite.

The reason why the intensity ratio R of the differential component and to the common mode component does not become infinite is mainly that there is a stray capacity between the spiral inductors L1 and L2, and the stray capacity tends to be nonsymmetrical with respect to the both ends of the spiral inductor L2. By connecting the condensers C3 and C4 of equal capacity at the both ends of the spiral inductor L2, the stray capacity becomes to be neglected to result in reduction of the common mode component in the differential signals.

Instead of the condensers C3 and C4, resistors R3 and R4 of equal resistance value can be employed. At this time, the resistors R3 and R4, identical as the condensers C3 and C4, reduce an influence of the stray capacity between the spiral inductors L1 and L2 to perform a function of increasing an intensity ratio R of the differential component to the common mode component.

(Embodiment 5)

Figure 6:
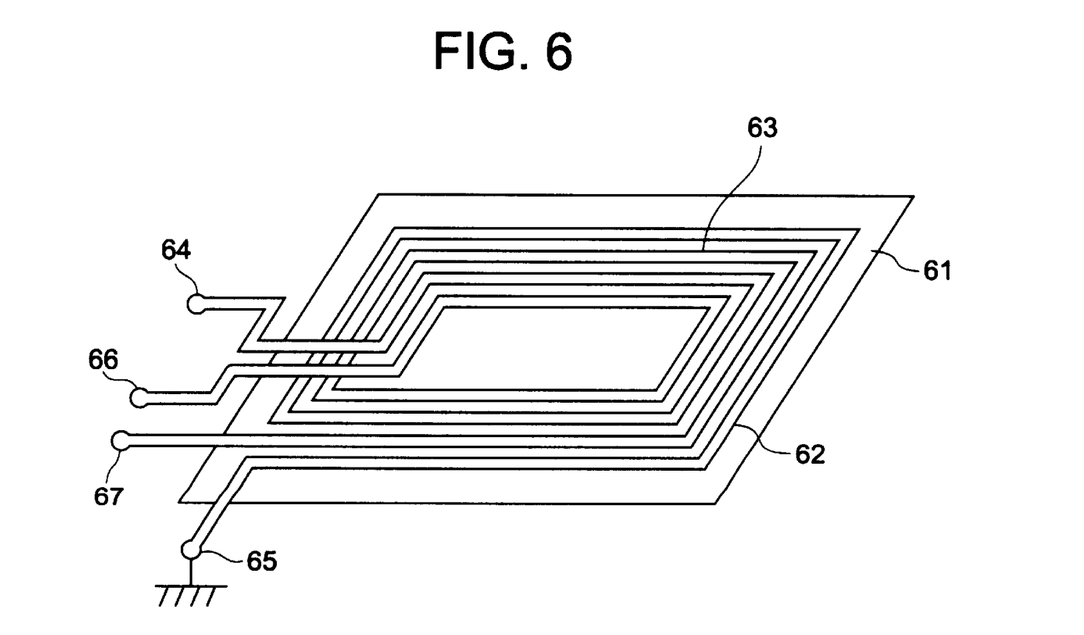
FIG. 6 is a diagram showing an embodiment of a converter for single-ended signals to differential signals conversion involving the present invention.

FIG. 6 is a diagram showing a fifth embodiment of a converter for single-ended signals to differential signals conversion of the present invention. In this embodiment, the spiral inductors L1 and L2 of FIG. 2, instead of disposing on a plurality of wiring layers, are disposed so as to nest within the same wiring layer to couple magnetically.

Within a wiring layer 61, a first conductor 62 is wound several turns to constitute a spiral inductor L1. A second conductor 63 is wound several turns between the first conductor 62 and within the wiring layer 61 to constitute a spiral inductor L2. That is, the first and second conductors 62 and 63 form a pair to be wound within the same wiring layer 61. One end 64 of the first conductor 62 is an input terminal of the single-ended signals terminal thereto an output of the single-ended signals is inputted, and the other end 65 thereof is grounded. Both ends 66 and 67 of the second conductor 63 are output terminals of the differential signals and are connected to the input terminals of differential signals of the second circuit.

In this embodiment, the spiral inductors for carrying out single-ended signals to differential signals conversion are formed within the same wiring layer. Accordingly, the constitution can be simplified and space saving can be attained.

(Embodiment 6)

Figure 7A:
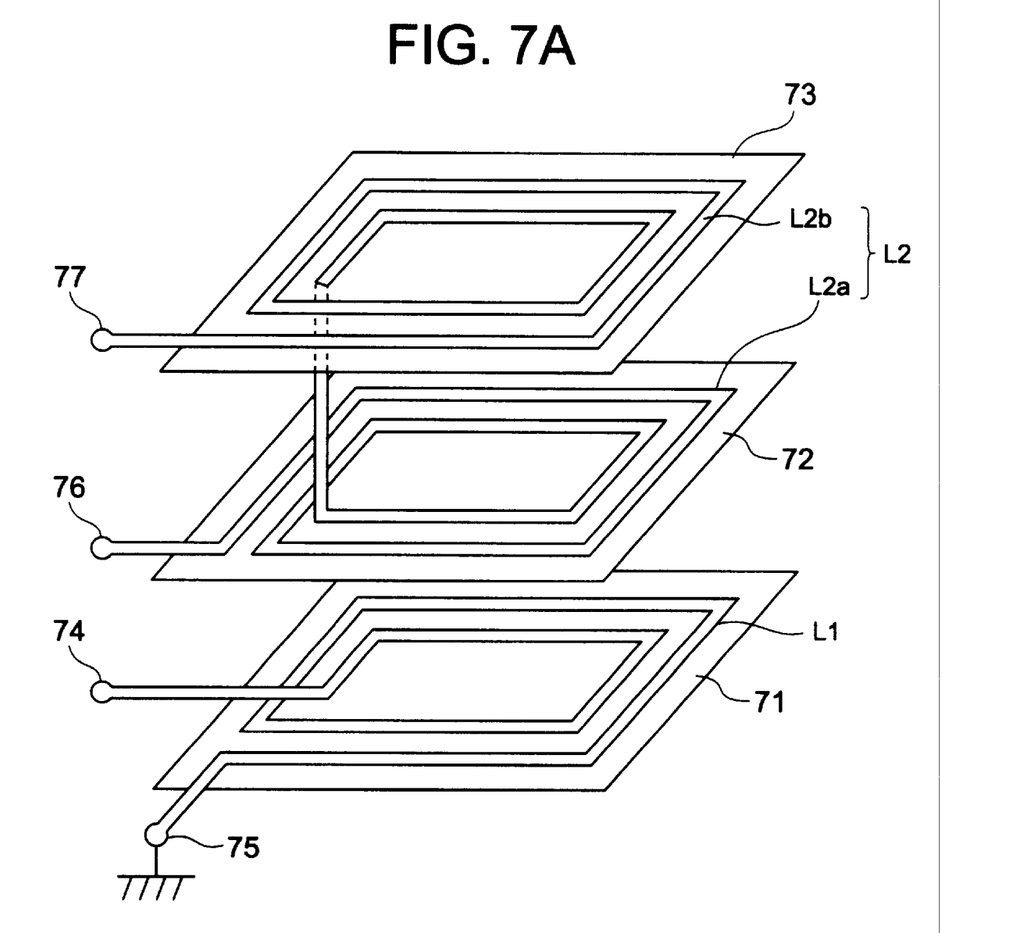
FIG. 7a and FIG. 7b are diagrams showing an embodiment of a converter for single-ended signals to differential signals conversion involving the present invention.
Figure 7B:
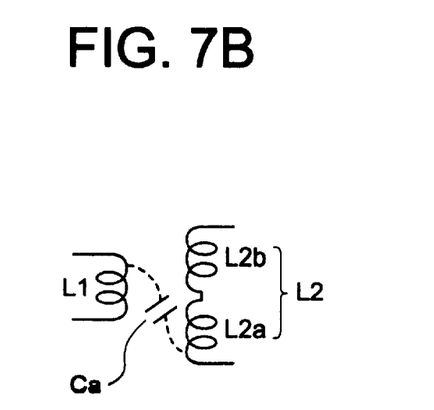

FIG. 7a and FIG. 7b are diagrams showing a sixth embodiment of a converter for single-ended signals to differential signals conversion of the present invention. As shown in FIG. 7a, within each of a first, second and third wiring layers 71, 72 and 73, spiral inductors L1, L2a and L2b are formed, respectively. One end 74 of the spiral inductor L1 is an input terminal thereto the single-ended signals are inputted, and the other end 75 thereof is grounded. End portions 76 and 77 of the spiral inductors L2a and L2b are output terminals for outputting the differential signals.

In this embodiment, the spiral inductor L2 is constituted of the spiral inductors L2a and L2b that are formed wound in the same direction within two wiring layers, respectively and connected in series. Accordingly, without increasing the chip area of an IC, the winding number of the spiral inductor L2 can be increased with ease. The increase of the winding number causes differential signal output converted from the single-ended signals to increase, that is, causes the conversion gain to increase.

In this embodiment, the spiral inductor L2 is formed over two wiring layers, but the spiral inductor L2 can be formed over three or more wiring layers. In addition, the spiral inductor L1 can be wound over two or more layers to increase the conversion gain similarly.

In this constitution, a distance between the spiral inductors L1 and L2a is smaller than that of the spiral inductors L1 and L2b. Accordingly, as shown in an equivalent circuit of FIG. 7b, there is a likelihood of occurrence of a stray capacity Ca between the spiral inductors L1 and L2a. The existence of this stray capacity Ca, as mentioned in the fourth embodiment, causes the common mode signal components to occur in the differential signals, resulting in hindering the intensity ratio R of the differential component to the common mode component from becoming infinite. However, the value of this stray capacity Ca is small enough not to disturb the conversion from the single-ended signals to differential signals. Rather than this, it is advantageous to obtain a larger differential output due to an increase of the winding number.

(Embodiment 7)

Figure 8A:
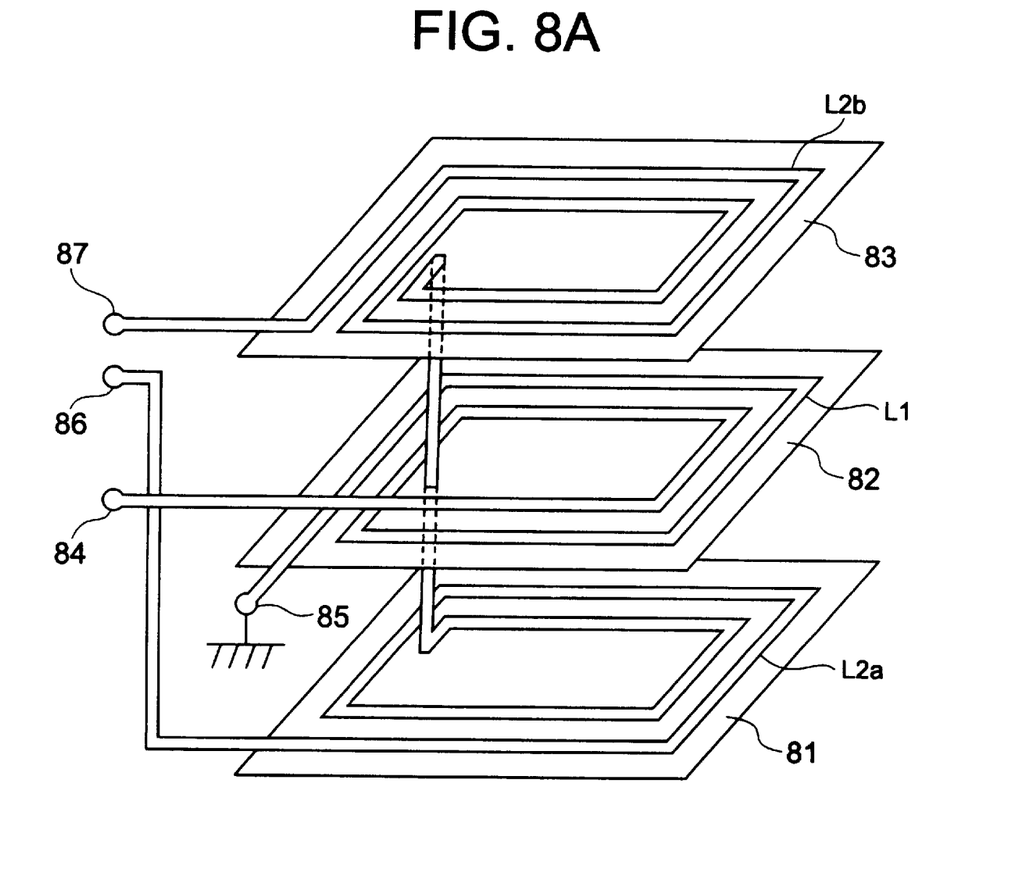
FIG. 8a and FIG. 8b are diagrams showing an embodiment of a converter for single-ended signals to differential signals conversion involving the present invention.
Figure 8B:
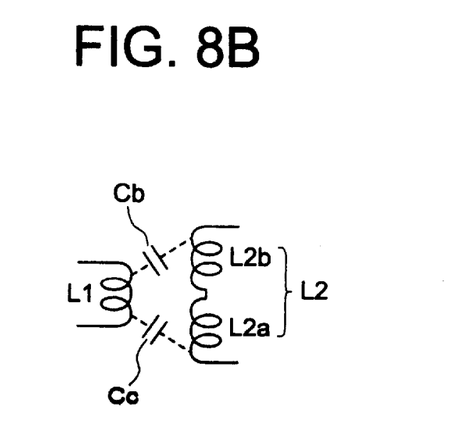

FIG. 8a and FIG. 8b are diagrams showing a seventh embodiment of a converter for single-ended signals to differential signals conversion of the present invention. In this embodiment, on an intermediate wiring layer 82 of three layers of wiring layers 81, 82 and 83, a spiral inductor L1 is formed and on the respective wiring layers 81 and 83 sandwiching the intermediate wiring layer 82, spiral inductors L2a and L2b are formed. The spiral inductors L2a and L2b are wound in the same direction and are connected in series. As a result of this, magnetic fluxes generated by the spiral inductors L2a and L2b are strengthened and the spiral inductors L2a and L2b as a whole constitute the spiral inductor L2. One end 84 of the spiral inductor L1 is an input terminal for inputting single-ended signals and the other end 85 is grounded. The terminals 86 and 87 of the respective spiral inductors L2a and L2b are output terminals for outputting the differential signals.

In this case, as shown in an equivalent circuit of FIG. 8b, between the spiral inductors L1 and L2a, and between the spiral inductors L1 and L2b, respectively, there occur parasite capacities Cb and Cc. However, in this constitution, by equalizing the distances, for instance, between the spiral inductors L1 and L2a, and between the spiral inductors L1 and L2b, the respective values of these parasite capacities Cb and Cc can be made equal to each other. As a result of this, the common mode signal component contained in the differential signals that is outputted at both ends of the spiral inductor L2 becomes smaller than that of the sixth embodiment. At this time, by equalizing the winding number of the spiral inductors L2a and L2b, the values of inductance of the spiral inductors L2a and L2b can be made equal. This is preferable in rejecting the common mode component.

In this embodiment, by forming the winding on each of a plurality of wiring layers to increase the number of wiring, and according to that increase, the conversion gain can be increased. The parasite capacity between the spiral inductors L1 and L2 becomes approximately equal at both terminals of the spiral inductor L2. Accordingly, the intensity ratio R of the differential component and the common mode component can be made larger.

(Embodiment 8)

Figure 9:
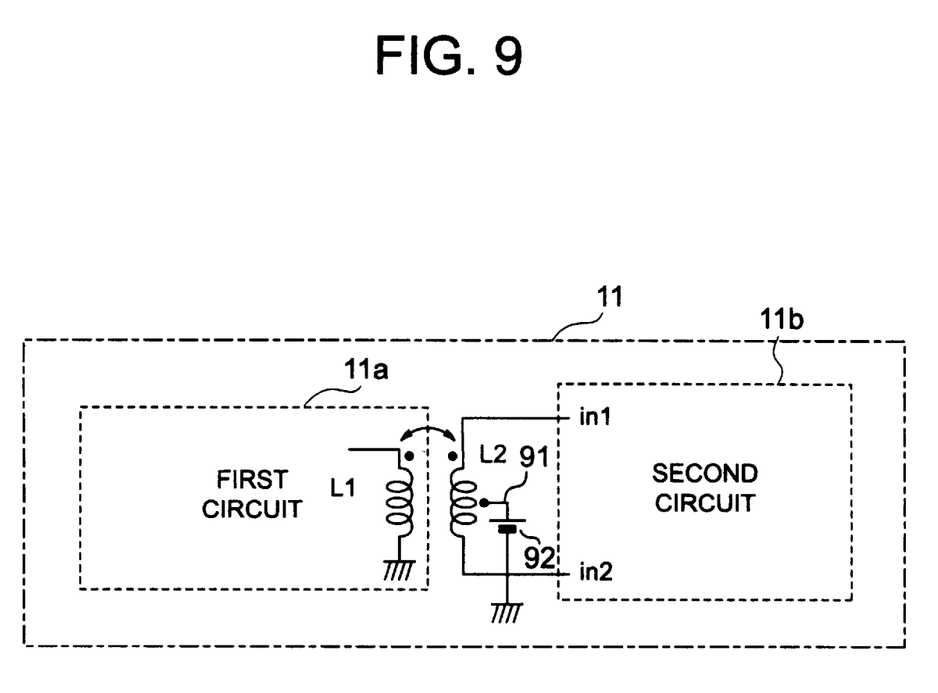
FIG. 9 is a diagram showing an embodiment of a converter for single-ended signals to differential signals conversion involving the present invention.

FIG. 9 is a diagram showing an eighth embodiment of a converter for single-ended signals to differential signals conversion of the present invention. In this embodiment, a lead 91 is given to the spiral inductor L2 of FIG. 1 and to this lead 91, a voltage source 92 is connected to supply a direct-current voltage bias.

In this embodiment, a direct-current voltage bias can be supplied from a midpoint of the secondary inductor L2, resulting in supplying the voltage bias with ease. Here, in the place of the voltage source 92, a current source can be connected thereto.

Figure 10:
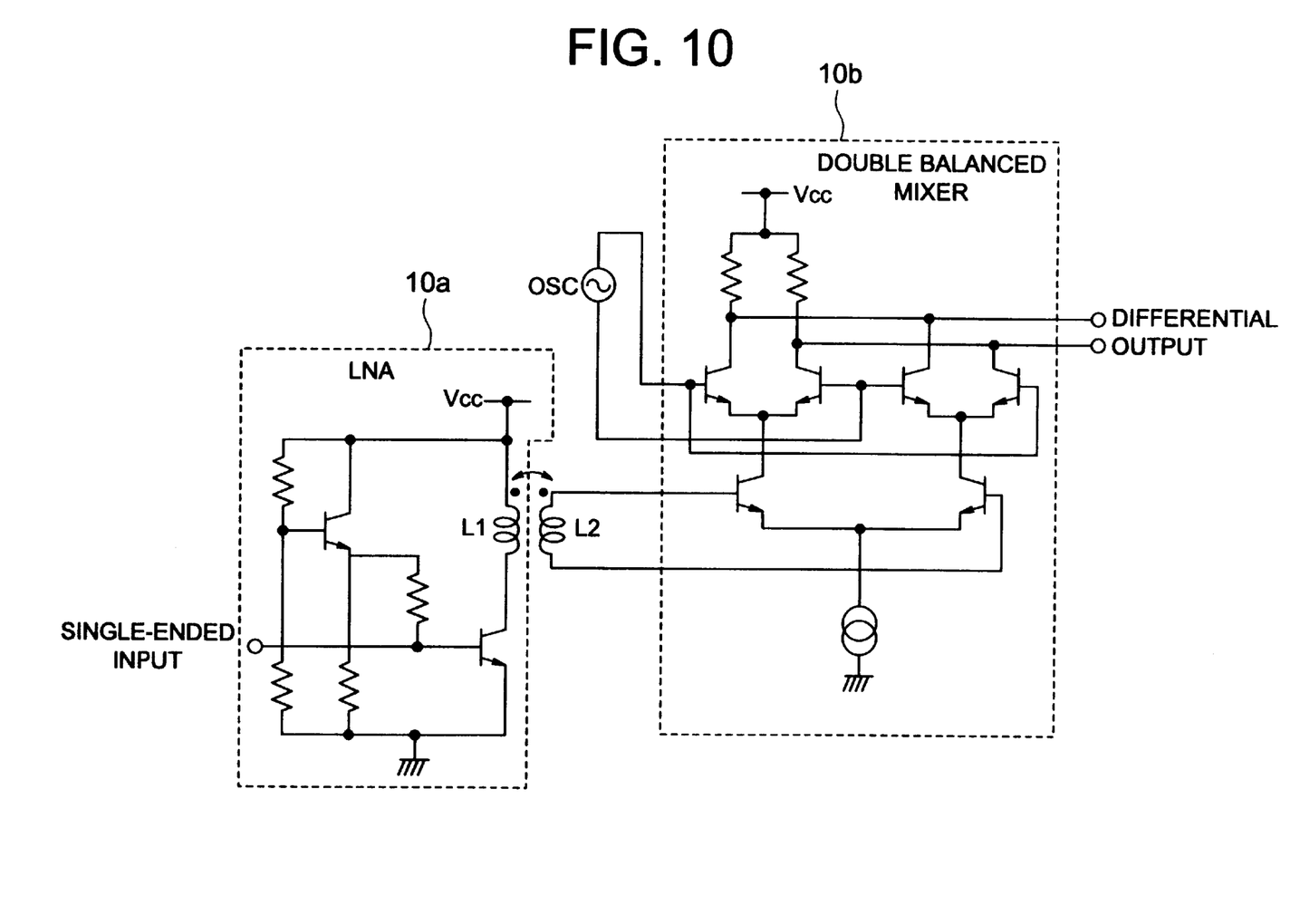
FIG. 10 is a diagram showing a specific embodiment of a converter for single-ended signals to differential signals conversion involving the present invention.
Figure 11:
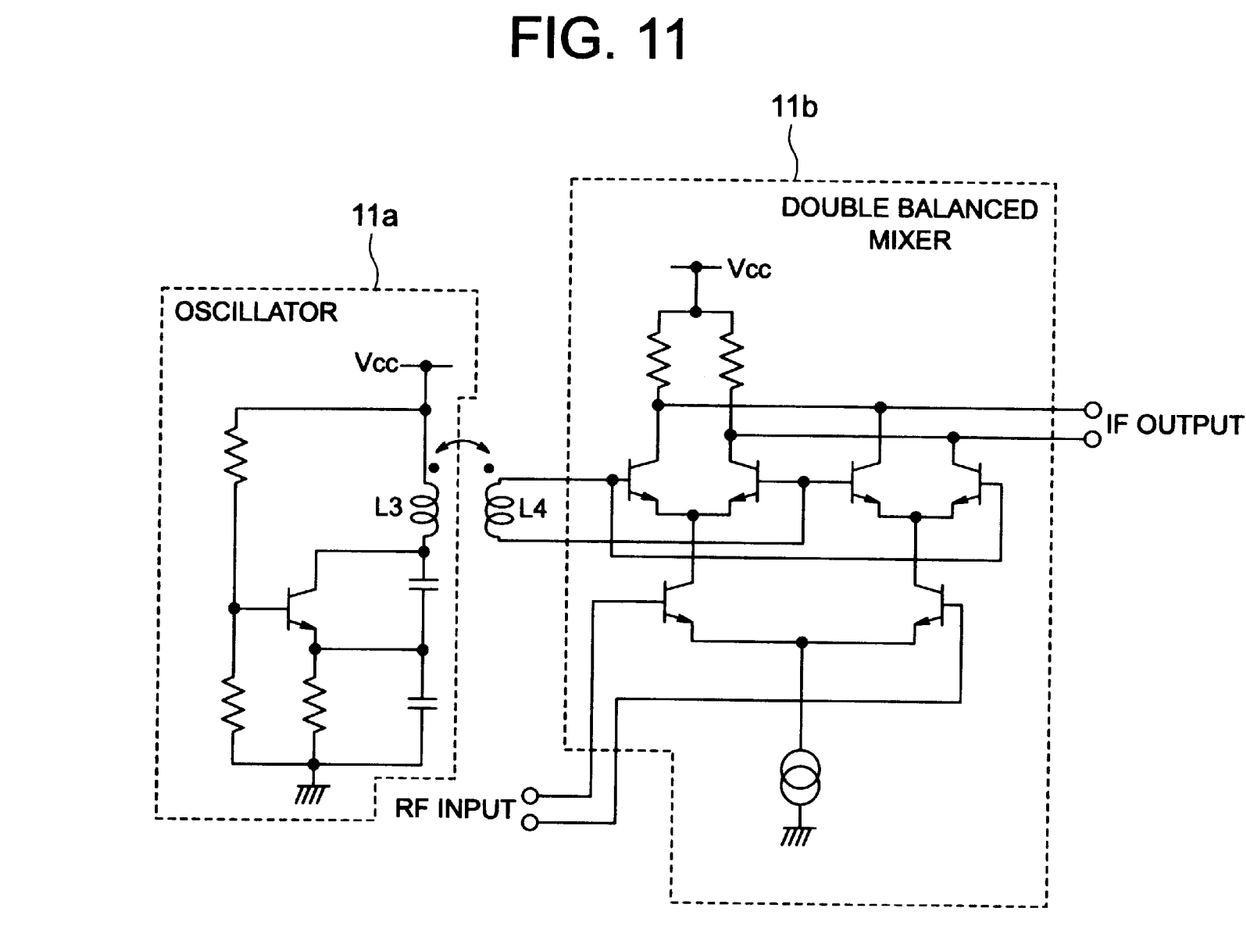
FIG. 11 is a diagram showing a specific embodiment of another single-ended signals to differential signals converter involving the present invention.

FIGS. 10 and 11 show specific examples in which the present inventions are used in actual circuits. FIG. 10 shows an example of a constitution in which the first circuit 10a is a low noise amplifier (LNA) and the second circuit 10b is a double balanced mixer. FIG. 11 shows an example of a constitution in which the first circuit 11a of FIG. 1 is a Colpitts oscillator and the second circuit 11b is a double balanced mixer.

Further, the examples of use of the present invention are not restricted to the aforementioned ones but the present invention can be applicable to portions where a circuit for carrying out single-ended signals to differential signals conversion within the same IC chip is required.

As explained in the above, in the single-ended signals to differential signals converter of the present invention, the spiral inductor L2 coupled magnetically with the spiral inductor L1 within a sending circuit is connected to the input terminal of the differential signals of receiving side. As a result of this, a conversion circuit in which a single-ended signals to differential signals converter itself does not consume electricity and is small in area and large in the intensity ratio R of the differential component to the common mode component can be obtained.

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

What is claimed is:

1. A single-ended signals to differential signals converter formed within a monolithic integrated circuit formed by integrating circuit elements on a semiconductor substrate, comprising:

a first circuit formed within the integrated circuit, the first circuit comprising a transistor outputting single ended signals and a first spiral inductor connected to an output terminal of either one of higher voltage side or lower voltage side of the transistor as an inductor for load use that contributes in determining frequency characteristics of the first circuit; and a second circuit formed within the integrated circuit, the second circuit comprising a pair of differential input terminals for inputting differential signals and a second spiral inductor that is magnetically coupled to the first spiral inductor and both ends thereof are connected to the respective differential input terminals, wherein to both ends of the second spiral inductor, each one end of a first condenser and a second condenser of substantially equal capacitance is connected, respectively, and each other end of he first condenser and the second condenser is grounded.

2. The single-ended signals to differential signals converter as set forth in claim 1:

wherein the first spiral inductor is formed within a first layer of the integrated circuit, and the second spiral inductor is formed within a second layer of the integrated circuit.

3. The single-ended signals to differential signals converter as set forth in claim 1:

wherein the first and second spiral inductors are formed as windings wound so as to adjoin to each other within the same wiring layer in the integrated circuit.

4. The single-ended signals to differential signals converter as set forth in claim 1:

wherein a first spiral inductor is formed within a first wiring layer in the integrated circuit, and a second spiral inductor is formed separated within a plurality of wiring layers different from the first wiring layer within the integrated circuit.

5. The single-ended signals to differential signals converter as set forth in claim 4:

wherein the second spiral inductor is formed within the second and third wiring layers;

wherein the second wiring layer and the third wiring layer are disposed with approximately equal distances sandwiching the first wiring layer.

6. The single-ended signals to differential signals converter as set forth in claim 5:

wherein winding numbers of the second spiral inductors formed within the respective second and third wiring layers are equal to each other.

7. The single-ended signals to differential signals converter as set forth in claim 1:

wherein a second spiral inductor is formed within a first wiring layer in the integrated circuit, and a first spiral inductor is formed separated within a plurality of wiring layers different from the first wiring layer within the integrated circuit.

8. The single-ended signals to differential signals converter as set forth in claim 1:

wherein a lead is given to the second spiral inductor and thereto a direct-current voltage bias is supplied.

9. The single-ended signals to differential signals converter as set forth in claim 1:

wherein the first circuit is a low noise amplifier, and the second circuit is a double balanced mixer.

10. A single-ended signals to differential signals converter formed within a monolithic integrated circuit formed by integrating circuit elements on a semiconductor substrate, comprising:

a first circuit formed within the integrated circuit, the first circuit being a resonant circuit in which a first spiral inductor is used as a resonator and that outputs a single-ended signal; and a second circuit formed within the integrated circuit, the second circuit comprising a pair of differential input terminals for inputting differential signals and a second spiral inductor that is magnetically coupled to the first spiral inductor and both ends thereof are connected to the respective differential input terminals, wherein to both ends of the second spiral inductor, each one end of a first condenser and a second condenser of substantially equal capacitance is connected, respectively, and each other end of the first condenser and the second condenser is grounded.

11. The single-ended signals to differential signals converter as set forth in claim 10:

wherein the first spiral inductor is formed within a first layer of the integrated circuit, and the second spiral inductor is formed within a second layer of the integrated circuit.

12. The single-ended signals to differential signals converter as set forth in claim 10:

wherein the first and second spiral inductors are formed as windings wound so as to adjoin to each other within the same wiring layer in the integrated circuit.

13. The single-ended signals to differential signals converter as set forth in claim 10:

wherein a first spiral inductor is formed within a first wiring layer in the integrated circuit, and a second spiral inductor is formed separated within a plurality of wiring layers different from the first wiring layer within the integrated circuit.

14. The single-ended signals to differential signals converter as set forth in claim 13:

wherein the second spiral inductor is formed within the second and third wiring layers;

wherein the second wiring layer and the third wiring layer are disposed with approximately equal distances sandwiching the first wiring layer.

15. The single-ended signals to differential signals converter as set forth in claim 14:

wherein winding numbers of the second spiral inductors formed within the respective second and third wiring layers are equal to each other.

16. The single-ended signals to differential signals converter as set forth in claim 10:

wherein a second spiral inductor is formed within a first wiring layer in the integrated circuit, and a first spiral inductor is formed separated within a plurality of wiring layers different from the first wiring layer within the integrated circuit.

17. The single-ended signals to differential signals converter as set forth in claim 10:

wherein a lead is given to the second spiral inductor and thereto a direct-current voltage bias is supplied.

18. The single-ended signals to differential signals converter as set forth in claim 10:

wherein the first circuit is a Colpitts oscillator, and the second circuit is a double balanced mixer.

19. A single-ended signals to differential signals converter as set forth in claim 1:

wherein the first circuit further comprises a third spiral inductor connected to the remaining output terminal of the higher voltage side and the lower voltage side of the transistor as an inductor for load use that contributes in determining frequency characteristics of the first circuit, and the first and the third spiral inductors are disposed so as to strengthen generated magnetic fluxes to each other, and wherein the second spiral inductor is magnetically coupled to the third spiral inductor.

20. A single-ended signals to differential signals converter formed within a monolithic integrated circuit formed by integrating circuit elements on a semiconductor substrate, comprising:

a first circuit formed within the integrated circuit, the first circuit comprising a transistor outputting single-ended signals and a first spiral inductor connected to an output terminal of either one of higher voltage side and lower voltage side of the transistor as an inductor for load use that contributes in determining frequency characteristics of the first circuit; and a second circuit formed within the integrated circuit, the second circuit comprising a pair of differential input terminals for inputting differential signals and a second spiral inductor that is magnetically coupled to the first spiral inductor and both ends thereof are connected to the respective differential input terminals, wherein a lead is given to the second spiral conductor and thereto a direct-current voltage bias is supplied.

21. The single-ended signals to differential signals converter as set forth in claim 20:

wherein the first spiral inductor is formed within a first layer of the integrated circuit, and the second spiral inductor is formed within a second layer of the integrated circuit.

22. The single-ended signals to differential signals converter as set forth in claim 20:

wherein to both ends of the second spiral inductor, each one end of a first condenser and a second condenser of substantially equal capacitance is connected, respectively, and each other end of the first condenser and the second condenser is grounded.

23. The single-ended signals to differential signals converter as set forth in claim 20:

wherein the first and second spiral inductors are formed as windings wound so as to adjoin to each other within the same wiring layer in the integrated circuit.

24. The single-ended signals to differential signals converter as set forth in claim 20:

wherein a first spiral inductor is formed within a first wiring layer in the integrated circuit, and a second spiral inductor is formed separated within a plurality of wiring layers different from the first wiring layer within the integrated circuit.

25. The single-ended signals to differential signals converter as set forth in claim 24:

wherein the second spiral inductor is formed within the second and third wiring layers;

wherein the second wiring layer and the third wiring layer are disposed with approximately equal distances sandwiching the first wiring layer.

26. The single-ended signals to differential signals converter as set forth in claim 25:

wherein winding numbers of the second spiral inductors formed within the respective second and third wiring layers are equal to each other.

27. The single-ended signals to differential signals converter as set forth in claim 20:

wherein a second spiral inductor is formed within a first wiring layer in the integrated circuit, and a first spiral inductor is formed separated within a plurality of wiring layers different from the first wiring layer within the integrated circuit.

28. The single-ended signals to differential signals converter as set forth in claim 20:

wherein the first circuit is a low noise amplifier, and the second circuit is a double balanced mixer.

29. A single-ended signals to differential signals converter formed within a monolithic integrated circuit formed by integrating circuit elements on a semiconductor substrate, comprising:

a first circuit formed within the integrated circuit, the first circuit being a resonant circuit in which a first spiral inductor is used as a resonator and that outputs a single-ended signal; and a second circuit formed within the integrated circuit, the second circuit comprising a pair of differential input terminals for inputting differential signals and a second spiral inductor that is magnetically coupled to the first spiral inductor and both ends thereof are connected to the respective differential input terminals, wherein a lead is given to the second spiral inductor and thereto a direct-current voltage bias is supplied.

30. The single-ended signals to differential signals converter as set forth in claim 29:

wherein the first spiral inductor is formed within a first layer of the integrated circuit, and the second spiral inductor is formed within a second layer of the integrated circuit.

31. The single-ended signals to differential signals converter as set forth in claim 31:

wherein to both ends of the second spiral inductor, each one end of a first condenser and a second condenser of substantially equal capacitance is connected, respectively, and each other end of the first condenser and the second condenser is grounded.

32. The single-ended signals to differential signals converter as set forth in claim 29:

wherein the first and second spiral inductors are formed as windings wound so as to adjoin. to each other within the same wiring layer in the integrated circuit.

33. The single-ended signals to differential signals converter as set forth in claim 29:

wherein a first spiral inductor is formed within a first wiring layer in the integrated circuit, and a second spiral inductor is formed separated within a plurality of wiring layers different from the first wiring layer within the integrated circuit.

34. The single-ended signals to differential signals converter as set forth in claim 33:

wherein the second spiral inductor is formed within the second and third wiring layers;

wherein the second wiring layer and the third wiring layer are disposed with approximately equal distances sandwiching the first wiring layer.

35. The single-ended signals to differential signals converter as set forth in claim 34:

wherein winding numbers of the second spiral inductors formed within the respective second and third wiring layers are equal to each other.

36. The single-ended signals to differential signals converter as set forth in claim 29:

wherein a second spiral inductor is formed within a first wiring layer in the integrated circuit, and a first spiral inductor is formed separated within a plurality of wiring layers different from the first wiring layer within the integrated circuit.

37. The single-ended signals to differential signals converter as set forth in claim 29:

wherein the first circuit is a Colpitts oscillator, and the second circuit is a double balanced mixer.

38. A single-ended signals to differential signals converter as set forth in claim 20:

wherein the first circuit further comprises a third spiral inductor connected to the remaining output terminal of the higher voltage side and the lower voltage side of the transistor as an inductor for load use that contributes in determining frequency characteristics of the first circuit, and the first and the third spiral inductors are disposed so as to strengthen generated magnetic fluxes to each other, and wherein a second spiral inductor is magnetically coupled to the third spiral inductor.

* * * * *

UNITED STATES PATENT AND TRADEMARK OFFICE
CERTIFICATE OF CORRECTION

PATENT NO.    : 6,259,325 B1
DATED         : July 10, 2001
INVENTOR(S)   : Ishizuka et al.

It is certified that error appears in the above-identified patent and that said Letters Patent is hereby corrected as shown below:

Column 8,
Line 66, change "he" to -- the --.

Column 12,
Line 22, change "adjoin." to -- adjoin --.

Signed and Sealed this

Twenty-sixth Day of March, 2002

Attest:

Attesting Officer

JAMES E. ROGAN
*Director of the United States Patent and Trademark Office*